United States Patent [19]

Pohlmann et al.

[11] 4,441,967
[45] Apr. 10, 1984

[54] METHOD OF PASSIVATING MERCURY CADMIUM TELLURIDE USING MODULATED DC ANODIZATION

[75] Inventors: Juergen L. W. Pohlmann, Alexandria, Va.; Michael Martinka, Gaithersburg, Md.

[73] Assignee: The United States of America as represented by the Secretary of the Army, Washington, D.C.

[21] Appl. No.: 452,681

[22] Filed: Dec. 23, 1982

[51] Int. Cl.³ .............................................. C25D 11/32
[52] U.S. Cl. .................................. 204/29; 204/32 R; 204/35 N; 204/56 R
[58] Field of Search ................. 204/15, 56 R, DIG. 9, 204/35 R, 35 N, 29, 32 R

[56] References Cited

U.S. PATENT DOCUMENTS

| | | |
|---|---|---|
| 3,798,135 | 3/1974 | Bracken et al. ........................ 204/15 |
| 3,929,589 | 12/1975 | Ermanis et al. ........................ 204/15 |
| 3,977,018 | 8/1976 | Catagnus et al. ...................... 357/30 |
| 4,338,176 | 7/1982 | Garcia Pelaez ...................... 204/228 |

Primary Examiner—Winston A. Douglas
Assistant Examiner—William Leader
Attorney, Agent, or Firm—Robert P. Gibson; Milton W. Lee; Aubrey J. Dunn

[57] ABSTRACT

Passivation of a mercury cadmium telluride surface is done by using square wave direct current, with the positive portion of the wave larger than the negative part.

5 Claims, 2 Drawing Figures

METHOD OF PASSIVATING MERCURY CADMIUM TELLURIDE USING MODULATED DC ANODIZATION

The invention described herein may be manufactured, used, and licensed by the U.S. Government for governmental purposes without the payment of any royalties thereon.

BACKGROUND OF THE INVENTION

This invention is in the field of passivation techniques for photodetector surfaces. In particular, it is concerned with a new method of passivating mercury cadmium telluride (HgCdTe) surfaces by anodizing. The surfaces are deposited as thin layers of HgCdTe on a CdTe substrate. An old method of anodizing surfaces on solid HgCdTe body is shown in U.S. Pat. No. 3,977,018 of Aug. 24, 1976. This patent teaches a method that uses a constant direct current for anodizing. Unfortuanately, it has been found in practice that the patent method has certain disadvantages. Specifically, the method will not provide a uniform anodic oxide surface if there are nonuniformities (peaks) on the HgCdTe surface. In the case of a thin HgCdTe layer on a CdTe substrate, such nonuniformities as normally occur and which can be smoothed by mechanical or chemical polishing on a solid body of HgCdTe, cannot be so removed because of the danger of damaging the thin layer. Moreover, the oxide surface, notwithstanding the patent teaching of providing a uniform thickness, has thickness variations and pinholes. The instant inventive method overcomes these disadvantages.

SUMMARY OF THE INVENTION

The invention is a new method of producing an anodic oxide on a workpiece with a HgCdTe surface. The method includes the known steps of preparing the surface, connecting it to an electrode, and immersing it into an electrolyte. The method starts by stripping any residual oxide and continues by using direct current (DC) for anodizing. However, instead of anodizing using essentially constant direct current as done by the prior art, the method uses square-wave modulated DC, with a portion of the square wave being cathodic. The final major step is annealing, wherein essentially constant anodic DC is applied. When annealing is complete, the workpiece is removed from the electrolyte, rinsed, and dried.

DESCRIPTION OF PREFERRED EMBODIMENT

Figure 1:
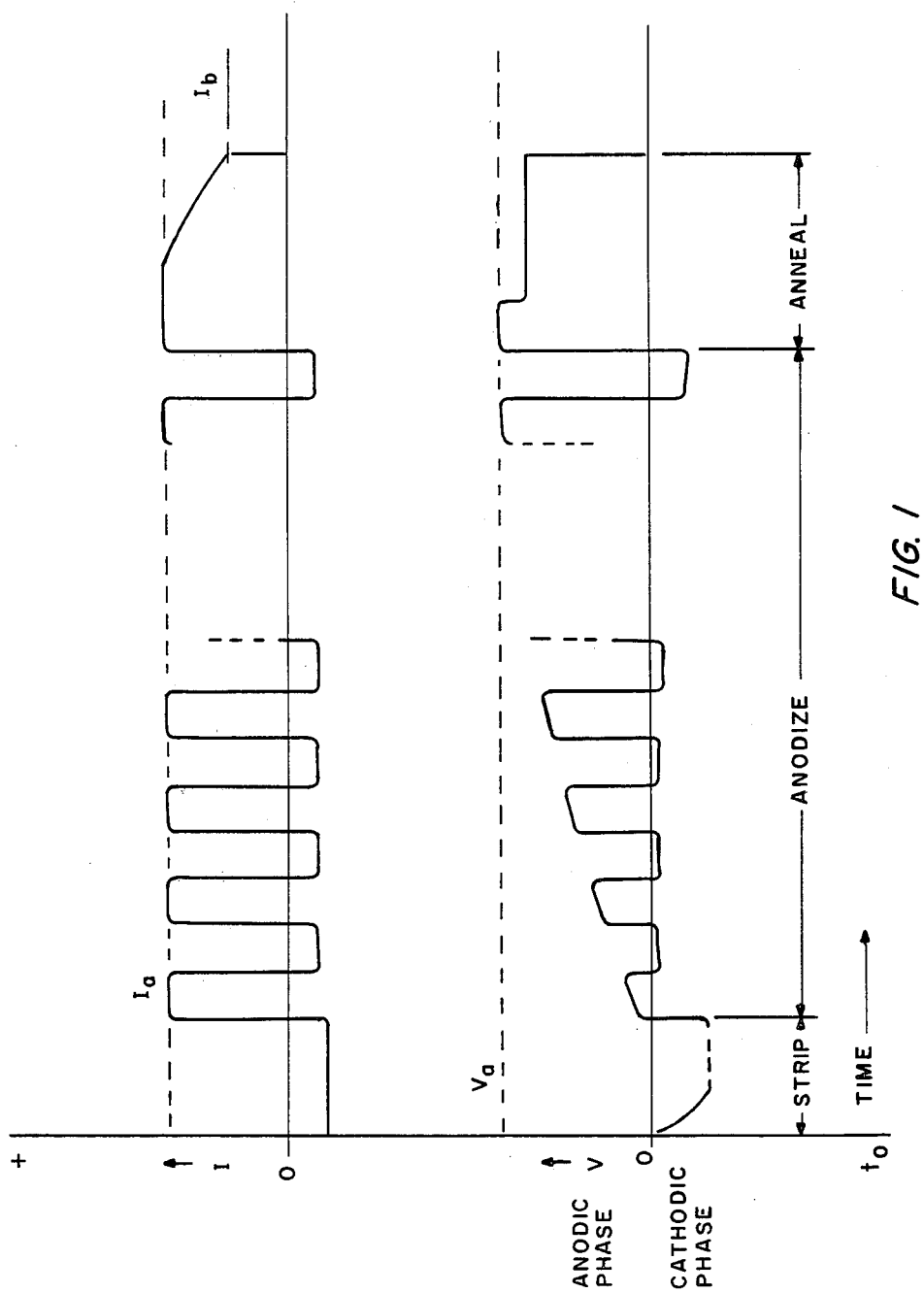
FIG. 1 shows voltage and current waveforms of the inventive method.
Figure 2:
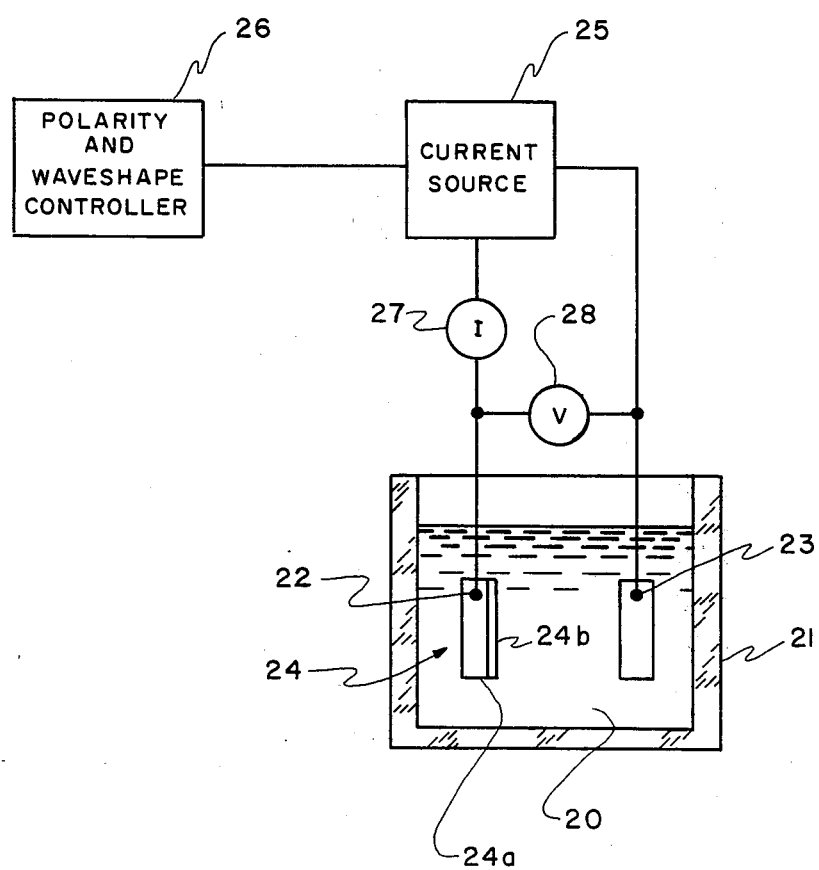
FIG. 2 is a schematic diagram of an apparatus capable of performing the inventive method.

The invention may be best understood when this description is taken in conjunction with the drawings. The voltage waveform of FIG. 1 shows the voltage between the anodizing terminals of the FIG. 2 diagram. As can be seen in FIG. 1, the method has three primary steps: strip, anodize, and anneal. It should be noted that the waveforms are not to scale; actual typical times and voltages will be given below. Referring for a moment to FIG. 2, we see an electrolytic circuit including electrolyte 20 in container 21. Immersed in 20 are electrodes 22 and 23, with a workpiece to be passivated generally designated 24 and connected to electrode 22. Workpiece 24 includes CdTe substrate 24a with HgCdTe layer 24b therein. Power is fed to the electrodes by current source 25 controlled by polarity and waveshape controller (function generator) 26. Respective meters 27 and 28 show current in the circuit and voltage between the electrodes. Controller 26 will include such means as a square wave generator and a timer, and can control 25 to provide either polarity of direct current, or modulated direct current. Except for controller 26, this circuit is equivalent to the one shown in FIG. 2 of the patent referred to in the BACKGROUND OF THE INVENTION, and electrolyte 20 is the same as in the patent. In order to understand how the instant inventive method operates to passivate the surface 24b of workpiece 24, we refer again to FIG. 1. The first step (strip) operates with 24 in a cathodic phase, i.e., electrode 22 is the cathode in the electrolytic circuit. As can be seen, the voltage builds to an asymptotic value. Stripping is continued until the voltage reaches 2 volts, or until 2 minutes pass, whichever occurs first. The second step (anodize) then begins, with actual anodizing occuring in the anode phase of the generally square voltage wave. The slight cathodic phase of the square voltage makes for a more even oxide layer by essentially stripping the peaks of the anodic surface formed and helping to even out in oxide thickness. The generally square wave asymptotically approaches some predetermined value ($V_a$ between 10 and 20 volts). The third and final major step (anneal) is started when the anodic voltage has reached the predetermined voltage. The voltage is then reduced to another constant value and maintained there until the previously constant current $I_a$ drops off to some predetermined value $I_b$. When annealing is complete, the workpiece is removed from the electrolyte and the power to the electrodes is turned off. The workpiece is then rinsed or washed and dried either still attached to the electrode, or detached therefrom, in the usual manner. The passivation as produced by this method is an oxide film with few surface defects compared to methods using only direct current. Apparently, two effects help produce this film: (1) the normal surface irregularities on the HgCdTe layer are somewhat reduced by modulated DC current, and (2) the oxide film formed by modulated DC current will form evenly on a rougher surface than the prior art pure DC method. Moreover, for surfaces of equal roughness, the instant method will provide a more dense oxide film.

A typical example of controller of function operator 26 is: the Universal Programmer (Model 175) as produced by Princeton Applied Research Corporation. Examples of current controller 25 are: Keithley Model 225 Constant Current Source and E/M Rowan Model C-612 Constant Current Source. Functions of 25 and 26 may both be performed by the Keithley Model 227 Constant Current Source, which is programmable for current waveshape.

A typical value for $I_a$ is 200 microamps, and $I_b$ will be about one-quarter to one-half of $I_a$. The stripping current may be 60 microamps and the cathodic current 50 microamps. All of these currents are for one square centimeter of workpiece surface area. The square wave frequency which we use is about (and not less than) 0.5 Hz. The frequency is determined by the ion mobility in the electrolyte. For higher frequencies, the ions cannot migrate, but begin to oscillate in place. Consequently, no defined cathodic phase can be maintained.

We claim:

1. In a method of passivating a mercury cadmium telluride surface on a workpiece comprised of a mercury cadmium telluride layer on a substrate, wherein the workpiece is passivated by the following steps:
   attach the workpiece to one electrode of an electrolytic circuit;
   immerse the workpiece in an electrolyte in which a second electrode of said electrolytic circuit is immersed; the improvement comprising the following steps:
   energize the electrolytic circuit with the workpiece as the cathode in the circuit, to strip surface oxide layers from the layer surface;
   energize said electrodes to anodize the layer surface with a generally square current wave having an anodic phase wherein the workpiece is energized as the anode in said electrolytic circuit and a cathodic phase in which the workpiece is energized as the cathode in said electrolytic circuit, and wherein the current in the cathodic phase is less than the current in the anodic phase, and, when a predetermined voltage is reached between said electrodes;
   energize with the workpiece as the anode using an essentially constant voltage until the current drops to a predetermined value to anneal the workpiece; and
   remove the workpiece from the electrolyte and deenergize said circuit.

2. The method as set forth in claim 1 wherein the anodizing anodic value of said square current is approximately 200 microamps per square centimeter of workpiece surface area and the cathodic current is approximately 50 microamps per square centimeter of workpiece surface area.

3. The method as set forth in claim 1 wherein the cathodic current used to strip surface oxide layers is approximately 60 microamps per square centimeter of workpiece surface area.

4. The method as set forth in claim 2 wherein the cathodic current used to strip surface oxide layers is approximately 60 microamps per square centimeter of workpiece surface area.

5. The method as set forth in claim 1 wherein the frequency of said square wave is approximately 0.5 Hz.

* * * * *